United States Patent
Chung

(10) Patent No.: US 6,819,146 B2
(45) Date of Patent: Nov. 16, 2004

(54) DATA RECEIVER AND DATA RECEIVING METHOD USING SIGNAL INTEGRATION

(75) Inventor: In-Young Chung, Gunpo (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/272,941

(22) Filed: Oct. 18, 2002

(65) Prior Publication Data

US 2003/0076134 A1 Apr. 24, 2003

(30) Foreign Application Priority Data

Oct. 23, 2001 (KR) ......................................... 2001-65448

(51) Int. Cl.[7] .............................................. H03K 5/22
(52) U.S. Cl. ........................................ 327/76; 327/336
(58) Field of Search ............................. 327/74–76, 336, 327/344

(56) References Cited

U.S. PATENT DOCUMENTS

| | | | |
|---|---|---|---|
| 5,355,391 A | 10/1994 | Horowitz et al. | ........... 327/108 |
| 5,889,423 A | * 3/1999 | Trumpp | ....................... 327/298 |
| 6,160,423 A | 12/2000 | Haq | ............................. 327/41 |

* cited by examiner

Primary Examiner—Kenneth B. Wells
(74) Attorney, Agent, or Firm—Harness, Dickey & Pierce, P.L.C.

(57) ABSTRACT

A data receiver and data receiving method using signal integration and capable of reducing high-frequency noises generated upon high-speed data detection. The data receiver includes an integration amplification circuit receiving at least two differential reference signals and N (where N is a natural number greater than zero) data signals and integrating and amplifying differences between the at least two differential reference signals and one or more of the N data signals and outputting at least first differential signals and at least second differential signals and a detection amplification circuit for receiving the at least first differential signals and the at least second differential signals and detecting a difference between the at least first differential signals and the at least second differential signals to detect a value of one or more of the N data signals The data receiver and data receiving method, using signal integration, can reduce high-frequency noises generated when data is detected at a high speed. The data receiver and data receiving method, where signals inputted through two reference signal lines and one data line are integrated and amplified to detect data, provide accurate data detection at a high speed using differential signaling, irrespective of changes in a process, voltage level, or temperature.

21 Claims, 8 Drawing Sheets

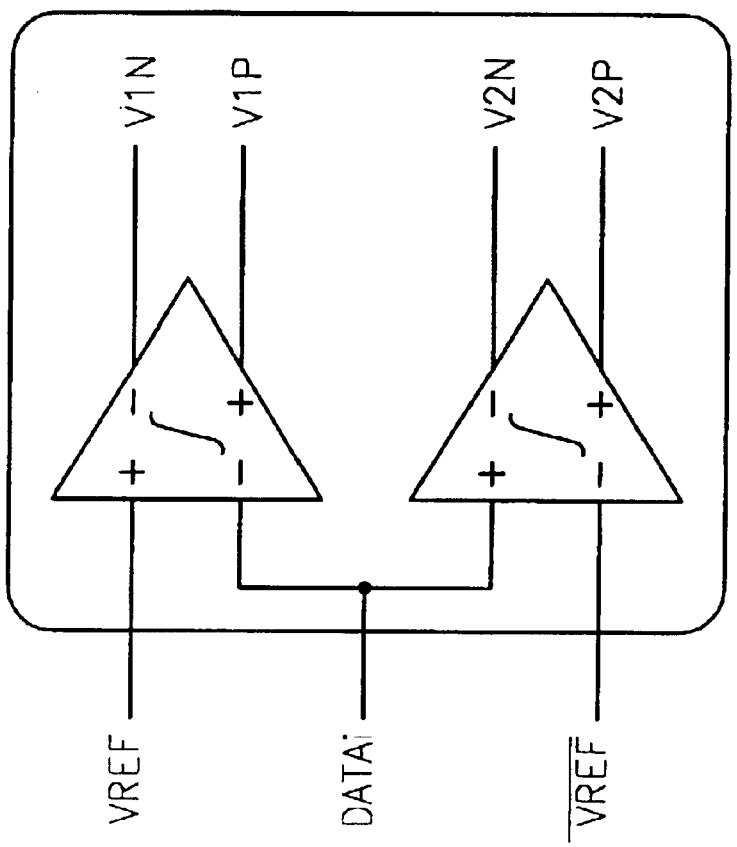
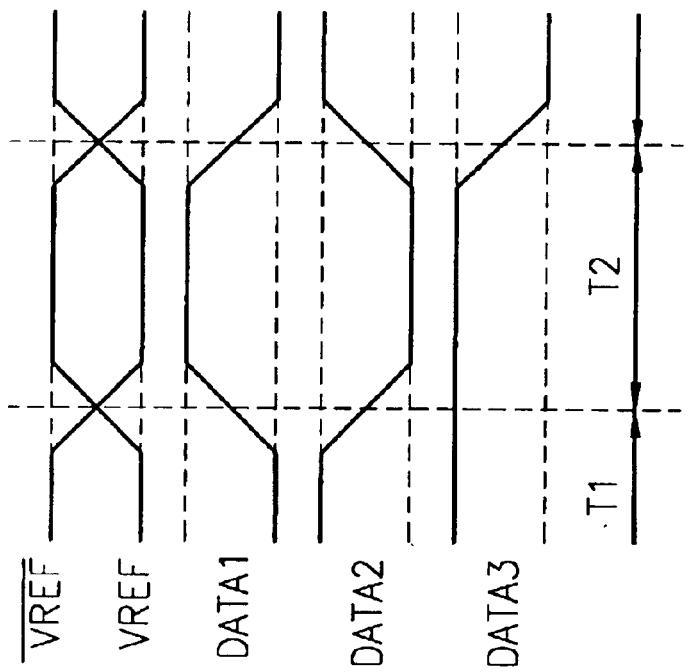
FIG. 6

DATA RECEIVER AND DATA RECEIVING METHOD USING SIGNAL INTEGRATION

BACKGROUND OF THE INVENTION

1. Field of the Invention

The present invention relates to a semiconductor device, and more particularly, to a data receiver and a data receiving method that integrate received differential reference signals and data synchronized with a clock signal and detect the received data.

2. Description of the Related Art

Differential receiving and/or transmitting data is one method for receiving and transmitting data between semiconductor devices. However, the method is disadvantageous in that the number of data lines needed to receive/transmit data is large.

FIG. 1 is a block diagram of a data receiver that uses conventional single reference signaling. FIG. 2 is a timing diagram showing the levels of the signals of FIG. 1.

With reference to FIGS. 1 and 2, a data receiver 10 has one reference signal line 1 used to receive a reference signal VREF, and N data lines 3, 5, . . . , 7 used to receive N data DATA1, DATA2, . . . , and DATAN. The data receiver 10 compares the reference signal VREF with each of the N data lines DATA1, DATA2, . . . , DATAN and detects the received data.

However, since the data receiver 10 that uses the single reference signaling technique is sensitive to noise, it cannot receive data at a high speed. In addition, due to attenuation of a transmission line, the faster the data transmission speed, the smaller the data size. As a result, the voltage difference DD1 between the reference signal VREF and the data DATA1, DATA2, . . . , DATAN is reduced. Therefore, it is difficult to detect the received data accurately.

FIG. 3 is a block diagram of another data receiver 20 that uses conventional differential signaling. FIG. 4 is a timing diagram showing the signal levels of FIG. 3. With reference to FIGS. 3 and 4, the data receiver 20 using differential signaling has 2N data lines 11, 13, . . . , 15, and 17 that are used to receive 2N data, DATAi and /DATAi, where i is 1 through N. DATAi and /DATAi are complementary data.

If the voltage difference DD2 inputted to the data receiver 20 is the same as the voltage difference DD1 inputted to the data receiver 10, the swing width of the data DATAi inputted to the data receiver 20 is reduced. As a result, the data receiver 20 can receive data at a high speed. However, the number of data lines of the data receiver 20 is N greater than that of the data receiver 10 using single reference signaling.

U.S. Pat. No. 6,160,423 discloses a high speed signaling technique. Because the trip-points of the two inverters of the receiver disclosed in detail in the '423 patent vary due to changes in a process, voltage, and temperature, the received data cannot be detected accurately. In addition, if levels of the output signals of comparators are low, it is difficult to detect the received data accurately.

Moreover, the receiver described in the '423 patent, which operates at a high frequency, cannot detect the received data accurately, and a glitch may occur during the switching operation of switches. Also, because the receiver described in the '423 patent uses an exclusive logical sum (XOR), the layout of the receiver requires more space.

SUMMARY OF THE INVENTION

In an exemplary embodiment, the present invention is directed to a data receiver and data receiving method that use signal integration to reduce high frequency noise.

In another exemplary embodiment, the present invention is directed to a data receiver and a data receiving method that is less sensitive to changes in a process, voltage, or temperature, and can detect data accurately and at high speed using two reference signal lines and a data line by differential signaling.

In another exemplary embodiment, the present invention is directed to a data receiver including an integration amplification circuit receiving at least two differential reference signals and N (where N is a natural number greater than zero) data signals and integrating and amplifying differences between the at least two differential reference signals and one or more of the N data signals and outputting at least first differential signals and at least second differential signals and a detection amplification circuit for receiving the at least first differential signals and the at least second differential signals and detecting a difference between the at least first differential signals and the at least second differential signals to detect a value of one or more of the N data signals.

In another exemplary embodiment, the present invention is directed to a data receiver including an integration amplification circuit for integrating and amplifying the difference between a first reference signal inputted through a first signal transmission line or the difference between a second reference signal inputted through a second signal transmission line and N (where N is a natural number greater than zero) data signals inputted through a third signal transmission line in response to a clock signal, and outputting at least first differential signals and at least second differential signals and a detection amplification circuit for receiving the at least first differential signals and the at least second differential signals and detecting a difference between the at least first differential signals and the at least second differential signals to detect a value of one or more of the N data signals.

In another exemplary embodiment, the present invention is directed to a data receiver including a first integration amplification circuit for integrating and amplifying the difference between a first of at least two reference signals and N (where N is a natural number greater than zero) data signals and outputting at least first differential signals in response to a clock signal, a second integration amplification circuit for integrating and amplifying the difference between a second of at least two reference signals and the N data signals and outputting at least second differential signals in response to the clock signal, and a detection amplification circuit for receiving the at least first differential signals and the at least second differential signals and detecting a difference between the at least first differential signals and the at least second differential signals to detect a value of one or more of the N data signals in response to the clock signal, wherein the first reference signal and the second reference signal of the at least two reference signals are differential signals.

In another exemplary embodiment, the first reference signal is inputted to a first input port of the first integration amplification circuit through a first signal transmission line, and the second reference signal is inputted to a first input port of the second integration amplification circuit through a second signal transmission line, wherein one or more of the N data signals is inputted to a second input port of each of the first integration amplification circuit and the second integration amplification circuit through a third signal transmission line.

In another exemplary embodiment, the first integration amplification circuit comprises a first precharge circuit for precharging the level of the at least first differential signals to the level of a first power voltage, in response to a first state of the clock signal and a first amplification circuit for integrating and amplifying the difference between the first of the at least two reference signals and one or more of the N data signals and outputting the at least first differential signals in response to a second state of the clock signal, wherein the second integration amplification circuit comprises a second precharge circuit for precharging the level of the at least two differential signals to the level of the first power voltage, in response to the first state of the clock signal and a second amplification circuit for integrating and amplifying the difference between the second of the at least two reference signals and one or more of the N data signals and outputting the at least second differential signals in response to the second state of the clock signal.

In another exemplary embodiment, the detection amplification circuit comprises a detection circuit for detecting and amplifying the difference between the at least first differential signals or the difference between the at least second differential signals and outputting at least third differential signals and a latch circuit for latching the at least third differential signals, wherein the at least third differential signals are precharged to the level of the first power voltage, in response to the first state of the clock signal, and are precharged to the CMOS level, in response to the second state of the clock signal.

In another exemplary embodiment, the present invention is directed to a data receiver including a first integration amplification circuit for integrating and amplifying the difference between at least two differential reference signals and N (where N is a natural number greater than zero) data signals and outputting at least first differential signals or at least second differential signals in response to a clock signal, a first detection amplification circuit for detecting and amplifying the difference between the at least first differential signals or the difference between the at least second differential signals and detecting odd numbered data of the N data signals in response to the clock signal, a second integration amplification circuit for integrating and amplifying the difference between the at least two differential reference signals and the N data signals and outputting at least third differential signals or at least fourth differential signals in response to the clock signal, and a second detection amplification circuit for detecting and amplifying the difference between the at least third differential signals or the difference between the at least fourth differential signals and detecting even numbered data of the N data signals in response to an inverted clock signal.

In another exemplary embodiment, the at least two differential reference signals are direct current (DC) or oscillating and the one or more of the N data signals is a single ended signal.

In another exemplary embodiment, the present invention, is directed to a data receiving method comprising (a) integrating and amplifying the difference between at least two differential reference signals and N (where N is a natural number greater than zero) data signals and outputting at least first differential signals or at least second differential signals in response to a clock signal and (b) detecting and amplifying the difference between the at least first differential signals or the difference between the at least second differential signals and detecting one or more of the N data signals in response to the clock signal.

In another exemplary embodiment, step (a) in the data receiving method includes (a1) precharging the levels of the at least first differential signals and the at least second differential signals to a first power voltage level, in response to a first state of the clock signal and (a2) integrating and amplifying the difference between the at least two reference signals and one or more of the N data signals and outputting the at least first differential signals or the at least second differential signals in response to a second state of the clock signal.

In another exemplary embodiment, step (b) in the data receiving method includes (b1) detecting and amplifying the difference between the at least first differential signals or the difference between the at least second differential signals and outputting at least third differential signals and (b2) precharging the at least third differential signals to the first power voltage level, in response to the first state of the clock signal, and outputting the at least third differential signals having the CMOS level, in response to the second state of the clock signal.

In another exemplary embodiment, the present invention is directed to a data receiving method including (a) integrating and amplifying the difference between at least two differential reference signals inputted through a first signal transmission line or a second signal transmission line, in response to a clock signal, and N (where N is a natural number greater than zero) data signals inputted through a third signal transmission line and outputting at least first differential signals or at least second differential signals and (b) detecting and amplifying the difference between the at least first differential signals or the difference between the at least second differential signals and detecting one or more of the N data signals in response to the clock signal.

In another exemplary embodiment, the present invention is directed to a data receiver comprising an integration amplification circuit receiving at least two differential reference signals and N (where N is a natural number greater than zero) data signals and integrating and amplifying differences between the at least two differential reference signals and one or more of the N data signals.

BRIEF DESCRIPTION OF THE DRAWINGS

The above exemplary embodiments of the present invention will become more apparent by describing in more detail one or more of the exemplary embodiments with reference to the attached drawings in which:

FIG. 6 is a timing diagram of input signals inputted to an integration amplification circuit of FIG. 5;

DETAILED DESCRIPTION OF THE INVENTION

Figure 1:
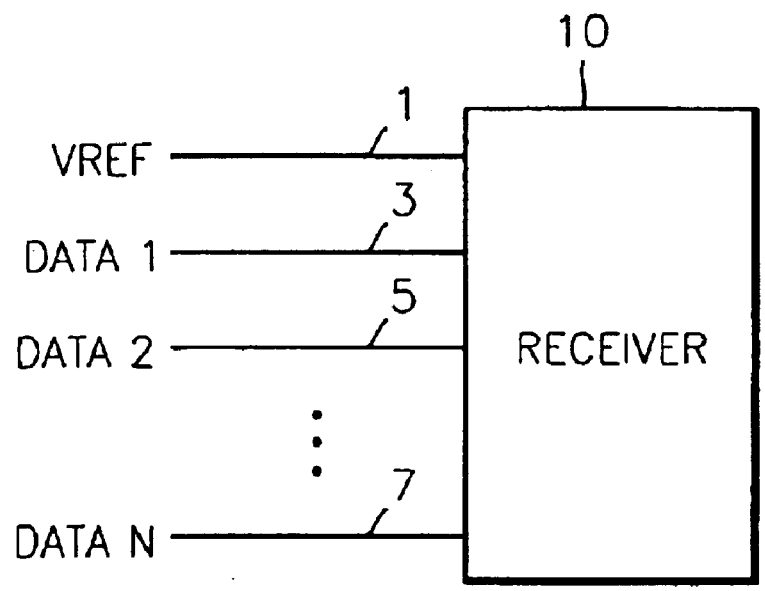
FIG. 1 is a block diagram of a data receiver that uses conventional existing single reference signaling.
Figure 2:
FIG. 2 is a timing diagram showing the levels of the signals of FIG. 1.
Figure 3:
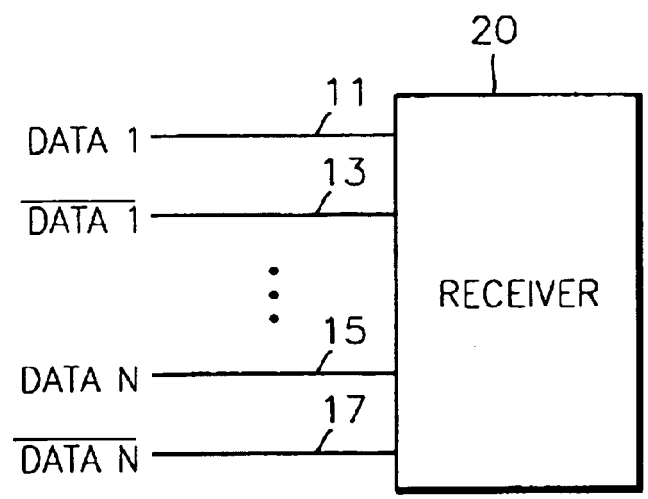
FIG. 3 is a block diagram of a data receiver that uses conventional differential signaling.
Figure 4:
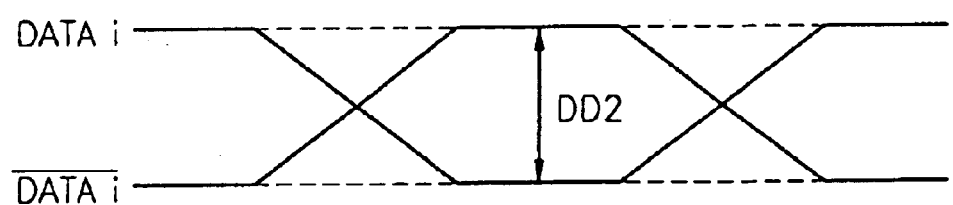
FIG. 4 is a timing diagram showing the levels of the signals of FIG. 3.

The present invention will now be described in detail by describing exemplary embodiments thereof with reference to the accompanying drawings. In the drawings, the same reference marks denote the same elements.

Figure 5:
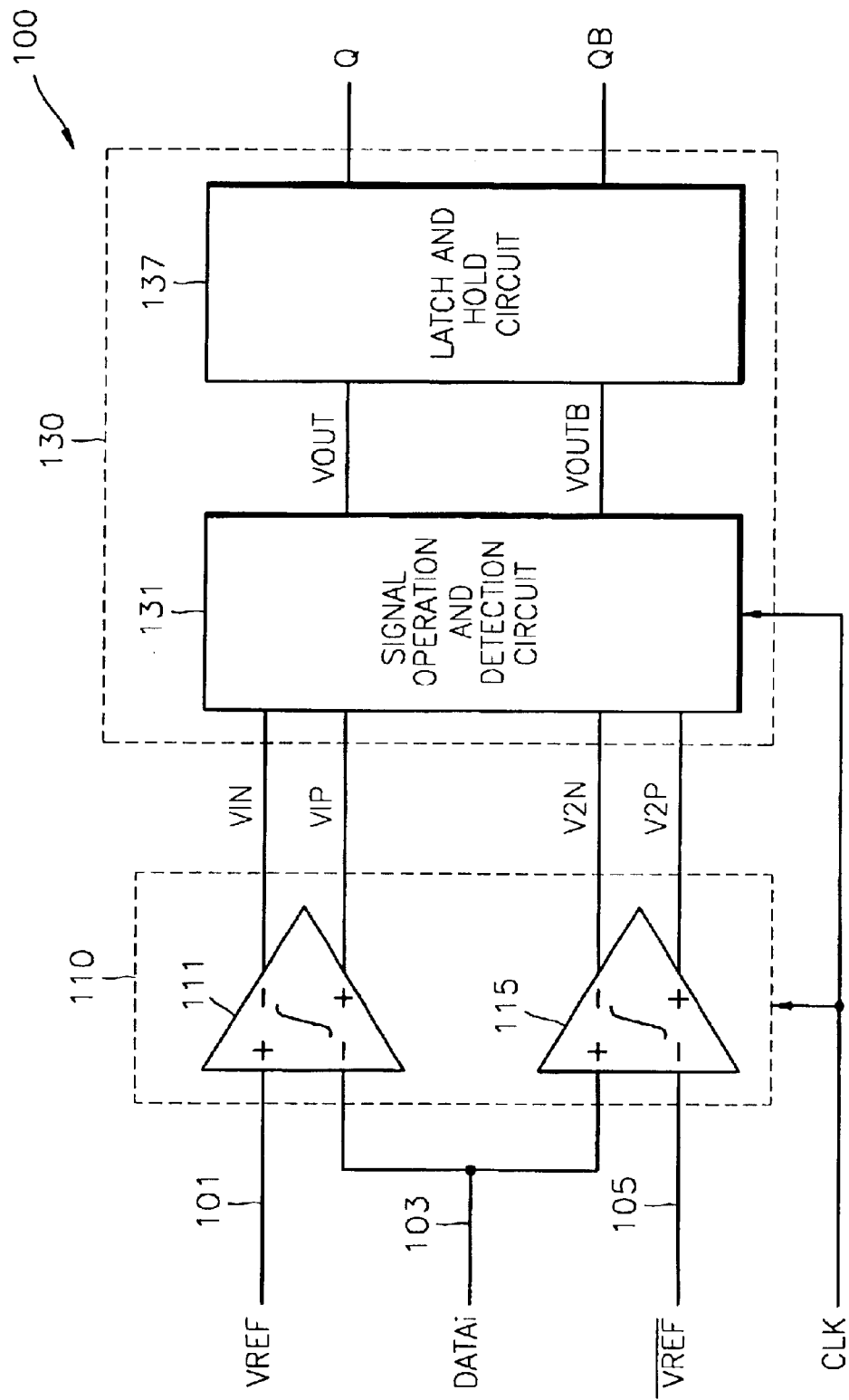
FIG. 5 is a circuit diagram of a data receiver according to an exemplary embodiment of the present invention.

FIG. 5 is a circuit diagram of a data receiver according to an exemplary embodiment of the present invention. For the convenience of explanation, FIG. 5 shows a data receiver 100 that has one data line 103 that is used to receive data DATAi and two reference signal lines 101 and 105 that are used to receive differential reference signals VREF and /VREF. In another exemplary embodiment, the differential reference signals VREF and /VREF are oscillating signals or direct current (DC) signals.

The data receiver 100, which receives N (N is a natural number, for example, N=16) data synchronized with a clock signal CLK in a signal integration method at a high speed, utilizes the two reference signal lines 101 and 105 to receive differential reference signals VREF and /VREF and N data lines used to receive N data.

With reference to FIG. 5, the data receiver 100 has an integration amplification circuit 110 and a detection amplification circuit 130. The integration amplification circuit 110 includes a first integration amplification circuit 111 and a second integration amplification circuit 115. The detection amplification circuit 130 includes a signal operation and detection circuit 131 and a latch and hold circuit 137.

In response to the clock signal CLK, the first integration amplification circuit 111 integrates and amplifies the difference between a first reference signal VREF inputted to a first input port through the signal transmission line 101 and the data DATAi inputted to a second input port through the signal transmission line 103. Then, based on the result, the first integration amplification circuit 111 outputs a first output signal V1P and a second output signal V1N to the signal operation and detection circuit 131 through the first output port and the second output port, respectively. The first output signal V1P and the second output signal V1N are differential signals.

In response to the clock signal CLK, the second integration amplification circuit 115 integrates and amplifies the difference between a second reference signal /VREF inputted to a fourth input port through a signal transmission line 105 and the data DATAi inputted to a third input port through a signal transmission line 103. Then, based on the result, the second integration amplification circuit 115 outputs a third output signal V2P and a fourth output signal V2N to the signal operation and detection circuit 131 through the third output port and the fourth output port, respectively. The third output signal V2P and the fourth output signal V2N are differential signals.

In response to the clock signal CLK, the signal operation and detection circuit 131 detects the difference between the first output signal V1P and the second output signal V1N or the difference between the third output signal V2P and the fourth output signal V2N by means of addition, deduction, and sensing. Then, the signal operation and detection circuit 131 outputs a fifth output signal VOUT and a sixth output signal VOUTB to the latch and hold circuit 137. The fifth output signal VOUT and the sixth output signal VOUTB are differential signals. In another exemplary embodiment, if the fifth output signal VOUT has the power voltage level VDD, the sixth output signal VOUTB has the ground voltage level VSS. However, the fifth output signal VOUT and the sixth output signal VOUTB may have voltage swings no greater than the full swing of the CMOS.

The latch and hold circuit 137 latches and holds the fifth output signal VOUT and the sixth output signal VOUTB, and outputs a seventh output signal Q and an eighth output signal QB. The seventh output signal Q and the eighth output signal QB are differential signals. The seventh output signal Q is the signal detected from the data (DATAi) inputted to the integration amplification circuit 110.

FIG. 6 is a timing diagram of input signals inputted to the integration amplification circuit 110 of FIG. 5. With reference to FIG. 6, the signals inputted to the integration amplification circuit 110 include the data DATAi, where i is 1 through 3, the first reference signal VREF and the second reference signal /VREF. The first and second data DATA1 and DATA2 are the same as the first reference signal VREF and the second reference signal /VREF, respectively, in terms of phase and size.

Figure 7:
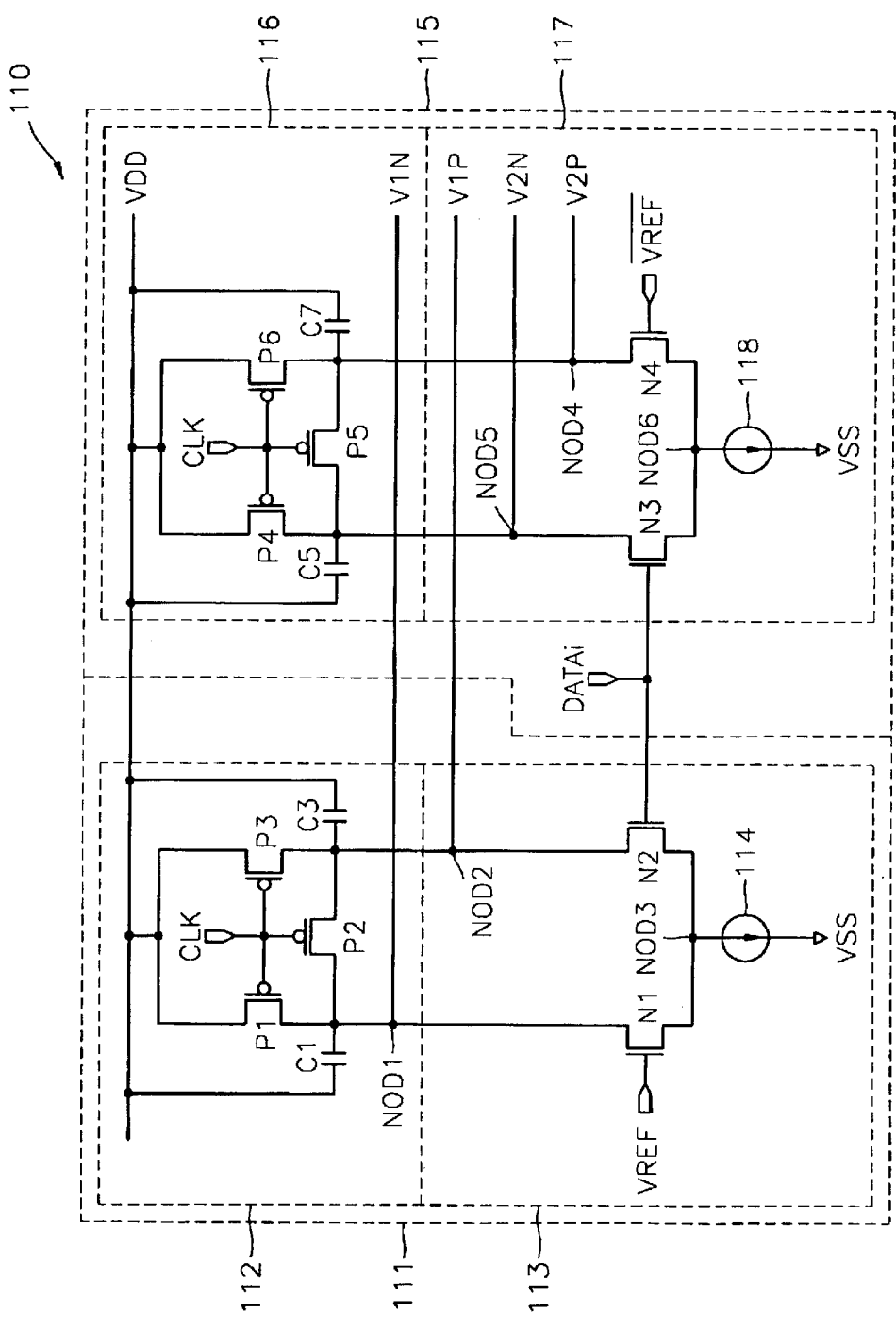
FIG. 7 is a circuit diagram of the integration amplification circuit of FIG. 5.

FIG. 7 is a circuit diagram of the integration amplification circuit 110 of FIG. 5. With reference to FIG. 7, the first integration amplification circuit 111 includes a first precharge circuit 112 and a first amplification circuit 113.

As for the configuration of the first precharge circuit 112, a first capacitor C1 is connected between a power voltage VDD and a node NOD1, and a second capacitor (C3) is connected between the power voltage VDD and a node NOD2.

The clock signal CLK is inputted to gates of PMOS transistors P1 through P3. The PMOS transistor P1 is connected between the power voltage VDD and the node NOD1. The PMOS transistor P3 is connected between the power voltage VDD and the node NOD2. The PMOS transistor P2 is connected between the node NOD1 and the node NOD2. For example, the nodes NOD1 and NOD2 are precharged to the level of the power voltage VDD in response to deactivation of the clock signal CLK.

As for the configuration of the first amplification circuit 113, the first reference signal VREF is inputted to a gate of an NMOS transistor N1 that is connected between the node NOD1 and a node NOD3. The data DATAi is inputted to a gate of an NMOS transistor N2 that is connected between the nodes NOD2 and NOD3. A first current source 114 is connected between the node NOD3 and the ground voltage VSS, and sinks the current of the node N3 towards the ground voltage VSS. The first output signal V1P is the output signal of the node NOD2, and the second output signal V1N is the output signal of the node NOD1.

The second integration circuit 115 includes a second precharge circuit 116 and a second amplification circuit 117. As for the configuration of the second precharge circuit 116, a third capacitor C5 is connected between the power voltage VDD and a node NOD5. A fourth capacitor C7 is connected between the power voltage VDD and a node NOD4.

The clock signal CLK is inputted to gates of PMOS transistors P4 through P6. The PMOS transistor P4 is connected between the power voltage VDD and the node NOD5. The PMOS transistor P6 is connected between the power voltage VDD and the node NOD4. The PMOS transistor P5 is connected between the nodes NOD4 and NOD5. For example, the nodes NOD4 and NOD5 are precharged to the level of the power voltage VDD in response to the deactivation of the clock signal CLK.

As for the configuration of the second amplification circuit 117, the second reference signal /VREF is inputted to a gate of an NMOS transistor N4, which is connected between the node NOD4 and a node NOD6. The data DATAi is inputted to a gate of an NMOS transistor N3, which is connected between the nodes NOD5 and NOD6. The second current source 118 is connected between the node NOD6 and the ground voltage VSS, and sinks the current of the node NOD6 towards the ground voltage VSS. The third output signal V2P and the fourth output signal V2N are output signals of the nodes NOD4 and NOD5, respectively.

The operation of the integration amplification circuit will be described with reference to FIGS. 6 and 7. For example, if the level of the first reference signal VREF is higher than the signal level of the data DATAi, the first integration amplification circuit 111 integrates and amplifies the difference between the level of the first reference signal VREF and the signal level of the data DATAi. Then, the first integration amplification circuit 111 outputs the second output signal V1N and the first output signal V1P, which has a higher signal level than the second output signal V1N.

If the level of the first reference signal VREF is lower than the signal level of the data DATAi, the first integration amplification circuit 111 integrates and amplifies the difference between the level of the first reference signal VREF and the signal level of DATAi. Then, the first integration amplification circuit 111 outputs the first output signal V1P and the second output signal V1N, which has a higher signal level than the first output signal V1P.

If the level of the first reference signal VREF is the same as the signal level of the data DATAi, the first output signal V1P and the second output signal V1N of the first integration amplification circuit 111 output the same signal level.

In addition, if the level of the second reference signal /VREF is higher than the signal level of the data DATAi, the second integration amplification circuit 115 integrates and amplifies the difference between the level of the second reference signal /VREF and the signal level of the data DATAi. Then, the second integration amplification circuit 115 outputs the fourth output signal V2N and the third output signal V2P, which has a lower signal level than the fourth output signal V2N.

If the level of the second reference signal /VREF is lower than the signal level of the data DATAi, the second integration amplification circuit 115 integrates and amplifies the difference between the level of the second reference signal VREF and the signal level of the data DATAi. Then, the second integration amplification circuit 115 outputs the fourth output signal V2N and the third output signal V2P, which has a higher signal level than the fourth output signal V2N.

In addition, if the level of the second reference signal /VREF is the same as the signal level of the data DATAi, the third output signal V2P and the fourth output signal V2N of the second integration amplification circuit 115 output the same signal level.

Figure 8:
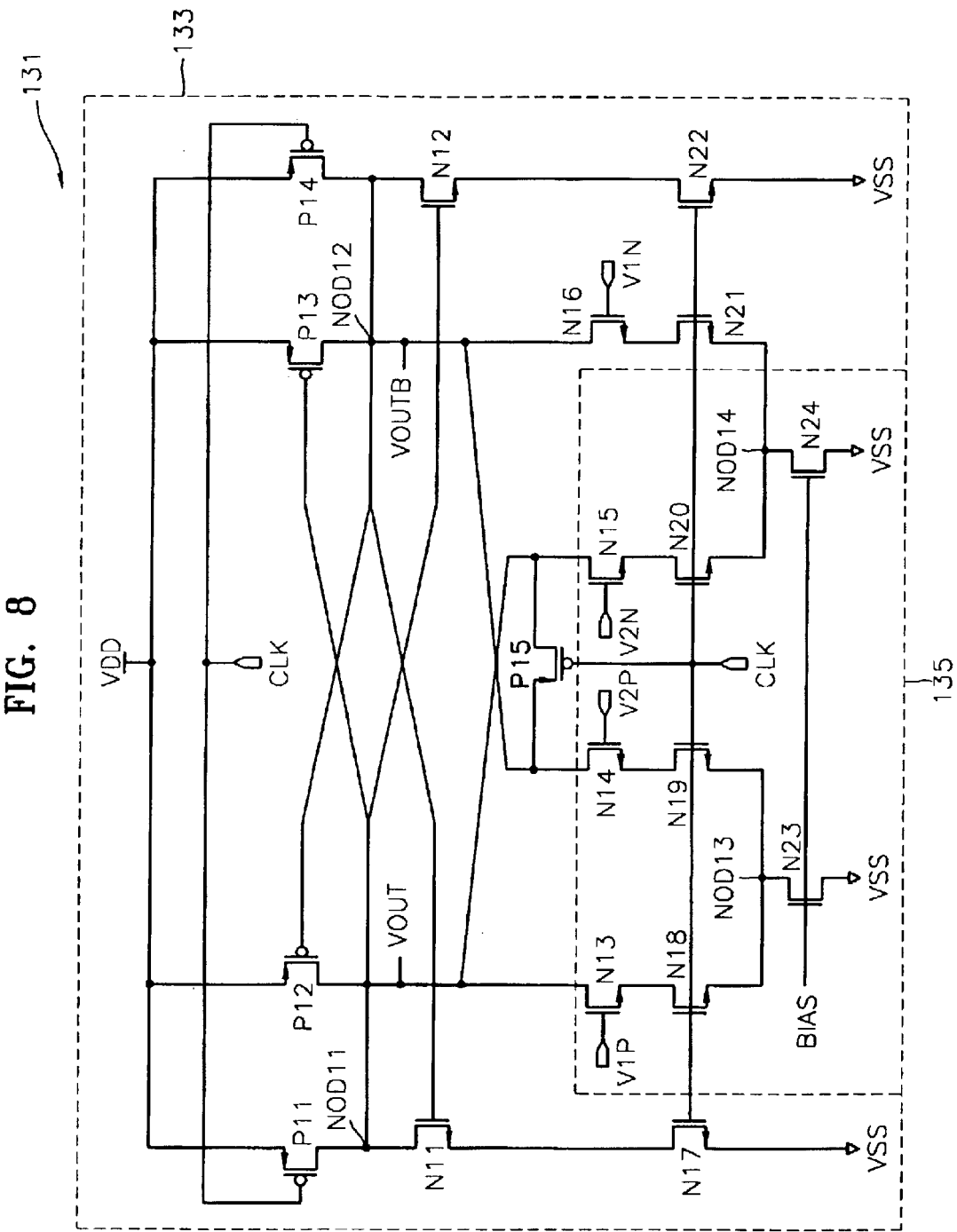
FIG. 8 is a circuit diagram of a signal operation and detection circuit of FIG. 5.

FIG. 8 is a circuit diagram of the signal operation and detection circuit 131 of FIG. 5. With reference to FIG. 8, the signal operation and detection circuit 131 includes a precharge circuit 133 and a detection circuit 135.

As for the configuration of the precharge circuit 133, the clock signal CLK is inputted to gates of PMOS transistors P11 and P14. The PMOS transistors P11 and P12 are connected between the power voltage VDD and the node NOD11, and the PMOS transistors P13 and P14 are connected between the power voltage VDD and the node NOD12.

In addition, the gate of the PMOS transistor P12 is connected to the node NOD12 and the gate of the PMOS transistor P13 is connected to the node NOD11. The PMOS transistor P15 is connected between the nodes NOD11 and NOD12.

NMOS transistors N11 and N17, which are connected serially, are connected between the node NOD11 and the ground voltage VSS. In particular, the gate of the NMOS transistor N11 is connected to the node NOD12. The clock signal CLK is inputted to the gate of the NMOS transistor N17. The NMOS transistors N12 and N22, which are connected serially, are connected between the node NOD12 and the ground voltage VSS. In particular, the gate of the NMOS transistor N12 is connected to the node NOD11. The clock signal CLK is inputted to the gate of the NMOS transistor N22.

The fifth output signal VOUT is the output signal of the node NOD11, and the sixth output signal VOUTB is the output signal of the node NOD12. For example, in response to the deactivation of the clock signal CLK, the precharge circuit 133 precharges the nodes NOD11 and NOD12 to the level of the power voltage VDD.

As for the configuration of the detection circuit 135, the NMOS transistors N13 and N18, which are connected serially, are connected between the nodes NOD11 and NOD13. In particular, the first output signal V1P is inputted to a gate of the NMOS transistor N13, and the clock signal CLK is inputted to the gate of the NMOS transistor N18. In addition, the NMOS transistors N14 and N19, which are connected serially, are connected between the nodes NOD12 and NOD13. In particular, the third output signal V2P is inputted to the gate of the NMOS transistor N14, and the clock signal CLK is inputted to the gate of the NMOS transistor N19.

In addition, NMOS transistors N16 and N21, which are connected serially, are connected between the nodes NOD12 and NOD14.

In particular, the second output signal V1N is inputted to the gate of the NMOS transistor N16, and the clock signal CLK is inputted to the gate of the NMOS transistor N21. The NMOS transistors N11 and N20, which are connected serially, are connected between the nodes NOD11 and NOD14. In particular, the fourth output signal V2N is inputted to the gate of the NMOS transistor N15, and the clock signal CLK is inputted to the gate of the NMOS transistor N20.

The NMOS transistor N23 is connected between the node NOD13 and the ground voltage VSS. A bias voltage BIAS is inputted to the gate of the NMOS transistor N23. In addition, the NMOS transistor N24 is connected between the node NOD14 and the ground voltage VSS. The bias voltage BIAS is inputted to the gate of the NMOS transistor N24. The NMOS transistors N23 and N24 are current sources.

Figure 9:
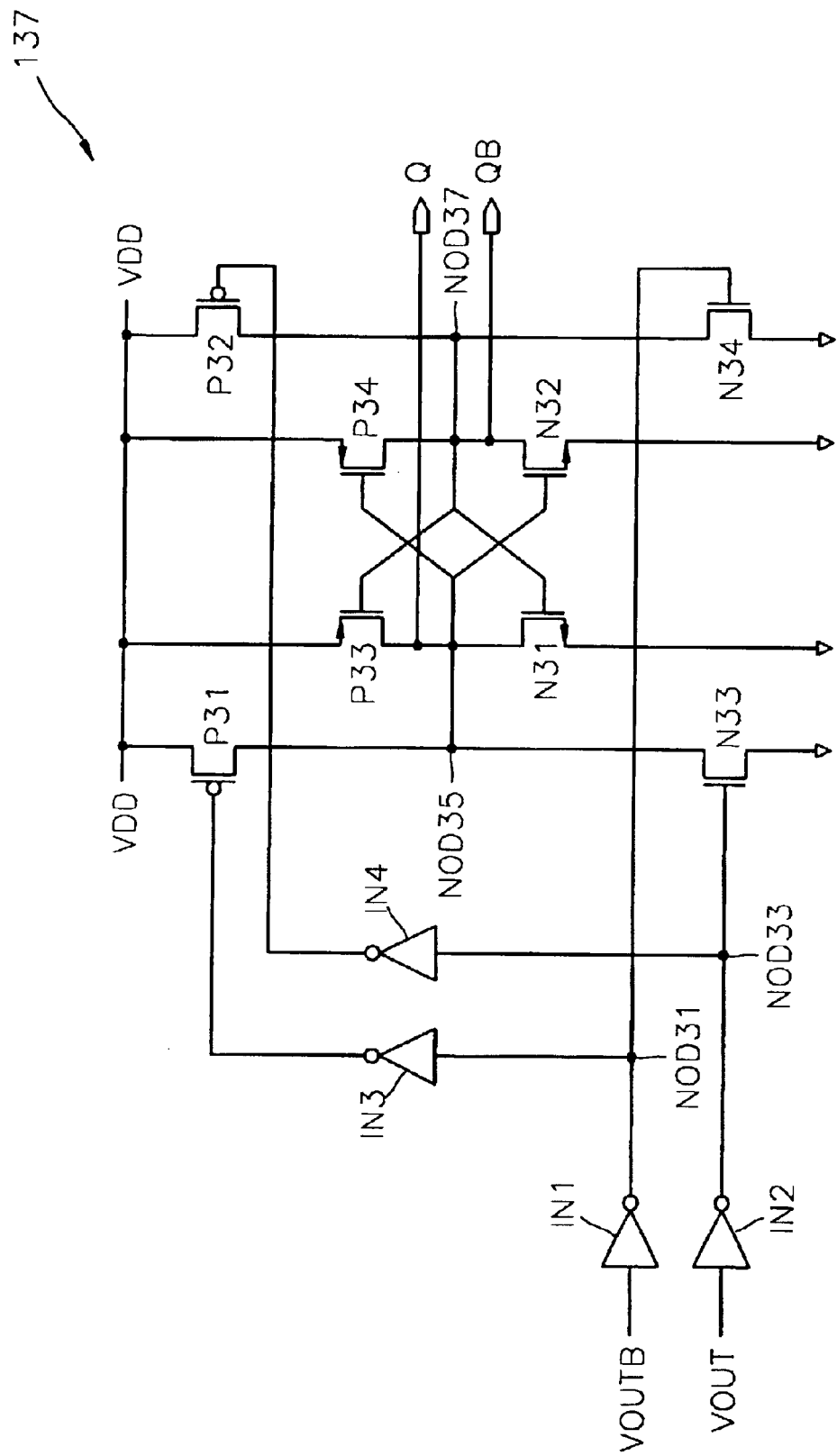
FIG. 9 is a circuit diagram of a latch and hold circuit of FIG. 5.

FIG. 9 is a circuit diagram of the latch and hold circuit 137 of FIG. 5. As for the configuration of a latch and hold circuit 137, the fifth output signal VOUT is inputted to an inverter IN2. The output port NOD33 of the inverter IN2 is connected to the gate of an NMOS transistor N33. The sixth output signal VOUTB is inputted to an inverter IN1, and the output port NOD31 of the inverter IN1 is connected to the gate of an NMOS transistor N34.

An inverter IN3 is connected between a node NOD31 and the gate of a PMOS transistor P31. An inverter IN4 is connected between a node NOD33 and the gate of a PMOS transistor P32. In addition, each of PMOS transistors P31 and P33 is connected between the power voltage VDD and a node NOD35. Each of NMOS transistors N31 and N33 is connected between the node NOD35 and the ground voltage VSS. In particular, the gates of the PMOS transistor P33 and the NMOS transistor N31 are connected to a node NOD37.

Each of PMOS transistors P32 and P34 is connected between the power voltage VDD and the node NOD37. Each of NMOS transistors N32 and N34 is connected between the node NOD37 and the ground voltage VSS. In particular, the gates of the PMOS transistor P34 and the NMOS transistor N32 are connected to the node NOD35. The seventh output signal Q is the output signal of the node NOD35, and the eighth output signal QB is the output signal of the node NOD37. The seventh output signal Q and the eighth output signal QB are complementary signals. The seventh and eighth output signals Q and QB of the latch and hold circuit 137 have full CMOS digital signal levels.

The operation of the data receiver 100 according to a first exemplary embodiment of the present invention will be described with reference to FIGS. 6 and 9. In addition, it is assumed that the nodes NOD4 and NOD5 shown in FIG. 7 and the nodes NOD11 and NOD12 shown in FIG. 8 are precharged to the level of the power voltage VDD in response to the deactivation of the clock signal CLK. The first reference signal and the second reference signal are indicated as VREF and /VREF, respectively.

The data receiver 100 detects the first data DATA1, whose logic level is low in a time interval T1 of FIG. 6, in the following way. The difference between the first data DATA1 and the first reference signal VREF is smaller than that between the first data DATA1 and the second reference signal /VREF. Therefore, if the clock signal CLK is activated, the second integration amplification circuit 115 of FIG. 7 operates more dominantly than the first integration amplification circuit 111. Therefore, the second integration amplification circuit 115 integrates and amplifies the difference between the first data DATA1 and the second reference signal /VREF, and then outputs the third output signal V2P and the fourth output signal V2N, corresponding to the difference.

That is, the second amplification circuit 117 of FIG. 7 receives the second reference signal /VREF and the first data DATA1, integrates and amplifies the difference between them, and outputs the third output signal V2P and the fourth output signal V2N, corresponding to the difference. In that case, the level of the third output signal V2P is lower than that of the fourth output signal V2N.

If the clock signal CLK and the bias voltage BIAS are activated, the detection circuit 135 of FIG. 8 outputs the sixth output signal VOUTB having the level of the power voltage VDD and the fifth output signal VOUT having the level of the ground voltage VSS in response to the third output signal V2P and the fourth output signal V2N, respectively. The fifth output signal VOUT and the sixth output signal VOUTB are differential signals and do not have full CMOS levels.

Since the NMOS transistor N33 of the latch and hold circuit 137 shown in FIG. 9 is turned on in response to the fifth output signal VOUT inverted by the inverter IN2, the seventh output signal Q becomes logically low. Therefore, the first data DATA1, whose logic level is low, is detected as low by the data receiver 100. That is, the detection amplification circuit 130 receives the second reference signal /VREF and the first data DATA1, and detects the inputted first data DATA1 as a result of addition, subtraction, sensing, and latching.

The data receiver 100 detects the second data DATA2, whose logic level is high in the time interval T1 of FIG. 6, in the following way. The difference between the second data DATA2 and the first reference signal VREF is larger than that between the second data DATA2 and the first reference signal /VREF. Therefore, if the clock signal CLK is activated, the first integration amplification circuit 111 of FIG. 7 operates more dominantly than the second integration amplification circuit 115.

Therefore, the first amplification circuit 113 of FIG. 7 receives the second data DATA2 and the first reference signal VREF, and integrates and amplifies the difference between them. Then, the first amplification circuit 113 outputs the first output signal V1P and the second output signal V1N, corresponding to the difference. In that case, the level of the first output signal V1P is lower than that of the second output signal V1N.

If the clock signal CLK and the bias voltage BIAS are activated, the detection circuit 135 of FIG. 8 may output the fifth output signal VOUT having the level of the power voltage VDD and the sixth output signal VOUTB having the level of the ground voltage VSS in response to the first output signal V1P and the second output signal V1N, respectively. In some cases, the fifth output signal VOUT and the sixth output signal VOUTB may not have full voltage swing. Therefore, the level of the fifth output signal VOUT may be lower than the level of the power voltage VDD, and the level of the sixth output signal VOUTB may be higher than the level of the ground voltage VSS. In another exemplary embodiment, the fifth output signal VOUT and the sixth output signal VOUTB are differential signals.

Since the NMOS transistor N34 of the latch and hold circuit 137 shown in FIG. 9 is turned on in response to the sixth output signal VOUTB inverted by the inverter IN1, the eighth output signal QB of the node NOD37 becomes logically low. However, because the PMOS transistor P31 is turned on by the sixth output signal VOUTB, the seventh output signal Q of the node NOD35 becomes logically high. The seventh and eighth output signals Q and QB of the latch and hold circuit 137 have full CMOS digital signal levels. Therefore, the second data DATA2, whose logic is high, is detected as 'high' by the data receiver 100.

In addition, the data receiver 100 detects the third data DATA3, whose logic level is high in the time interval T1 of FIG. 6, in the same way as the data receiver 100 detects the second DATA2. Therefore, the detection of the third DATA3, whose logic level is high, will not be explained here.

The data receiver 100 detects the first and third data DATA1 and DATA3, whose logic levels are high in a time interval T2 of FIG. 6, in the following way. With reference to FIG. 7, the second amplification circuit 117 operates more dominantly than the first amplification circuit 113, and the level of the third output signal V2P of the second amplification circuit 117 is higher than the level of the fourth output signal V2N.

Therefore, it is preferable that the sixth output signal (VOUTB) of FIG. 8 may be pulled down to the level of the ground voltage VSS in response to the third output signal V2P inputted to the NMOS transistor N14 and that the fifth output signal VOUT maintains the level of the power voltage VDD. However, the fifth output signal VOUT and the sixth output signal VOUTB may have not full voltage swing.

As a result, the signal operation and detection circuit 131 may output the fifth output signal VOUT having the level of the power voltage VDD and the sixth output signal VOUTB having the level of the ground voltage VSS to the latch and hold circuit 137.

The NMOS transistor N34 of the latch and hold circuit 137 of FIG. 9 is turned on in response to the output signal of the inverter IN1 and pulls down the eighth output signal QB to the level of the ground voltage VSS. The PMOS transistor P31 is turned on in response to the output signal of the inverter IN3 and pulls up the seventh output signal QB to the level of the power voltage VDD. Therefore, the first or third data DATA1 or DATA3, whose logic level is high in the time interval T2, is detected as high by the data receiver 100.

The data receiver 100 detects the second data DATA2, whose logic level is low in the time interval T2 of FIG. 6, in the following way. With reference to FIG. 7, the first amplification circuit 113 operates more dominantly than the second amplification circuit 117, and the level of the first output signal V1P of the first amplification circuit 113 is higher than that of the second output signal V1N.

Therefore, the fifth output signal VOUT of FIG. 8 may be pulled down to the level of the ground voltage VSS in response to the first output signal V1P inputted to the NOMS transistor N13 and that the sixth output signal VOUTB maintains the level of the power voltage VDD. However, the fifth output signal VOUT and the sixth output signal VOUTB may have voltage swings no greater than the full swing of the CMOS.

As a result, the signal operation and detection circuit 131 may output the sixth output signal VOUTB having the level of the power voltage VDD and the fifth output signal VOUT having the level of the ground voltage VSS to the latch and hold circuit 137. When the fifth output signal VOUT does not have full voltage swing, it has a low level.

The NMOS transistor N33 of the latch and hold circuit 137 of FIG. 9 is turned on in response to the output signal of the inverter IN2 and pulls down the seventh output signal Q to the level of the ground voltage VSS. The PMOS transistor P32 is turned on in response to the output signal of the inverter IN4 and pulls up the eighth output signal QB to the level of the power voltage VDD. Therefore, the second data DATA2, whose logic level is low in the time interval T2, is detected as 'low' by the data receiver 100.

Figure 10:
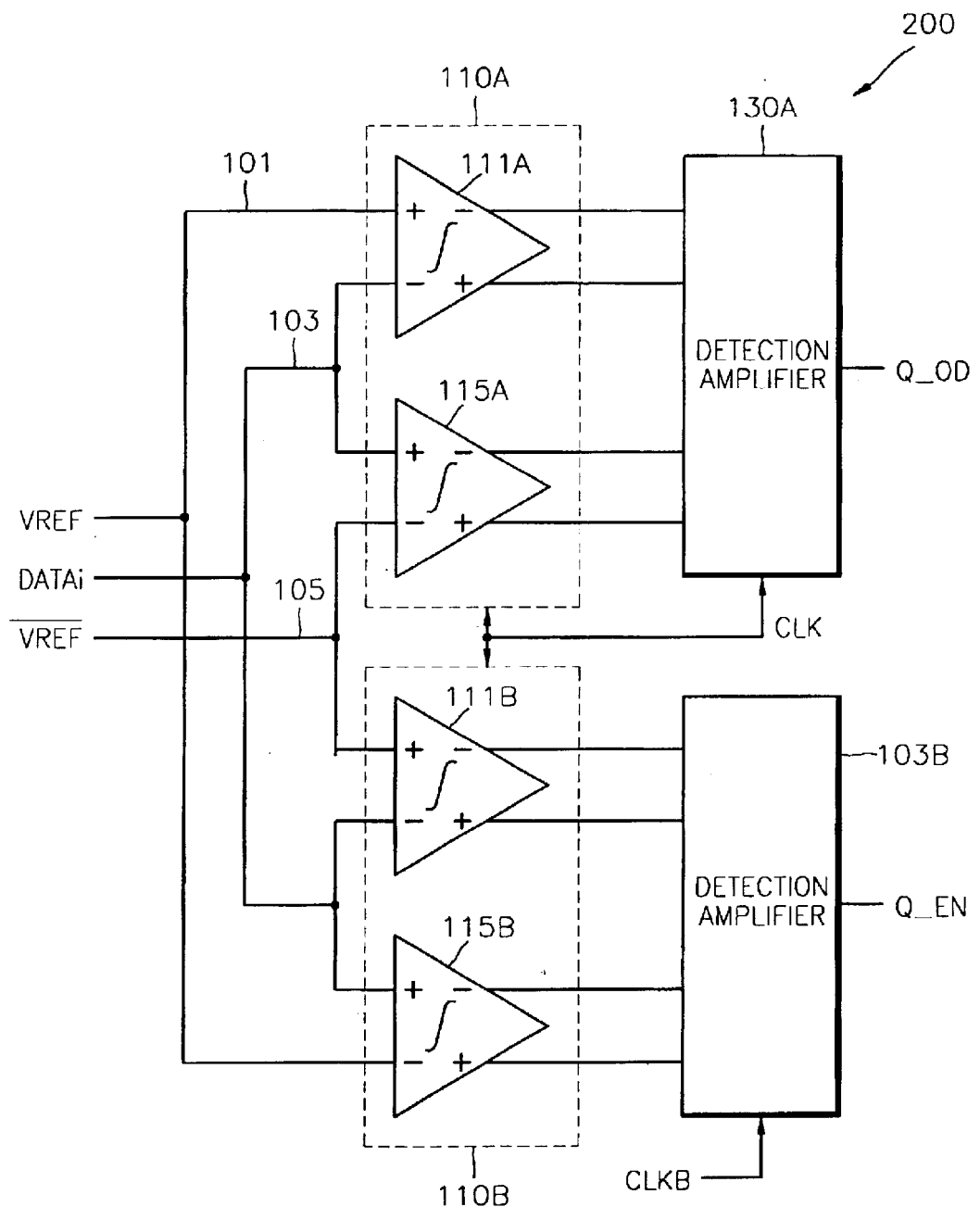
FIG. 10 is a circuit diagram of a data receiver according to another embodiment of the present invention.

FIG. 10 is a circuit diagram of a data receiver according to another exemplary embodiment of the present invention. With reference to FIG. 10, a data receiver 200 can receive odd numbered data and even numbered data.

The integration amplification circuit 110A and the detection amplifier 130A of the data receiver 200 detect the $N^{th}$ data. The integration amplification circuit 110B and the detection amplifier 130B of the receiver 200 detect the $N-1^{th}$ data.

The integration amplification circuits 111A and 115A or 111B and 115B of FIG. 10 may have the same structure and operation as the integration amplification circuits 111 and 115 of FIG. 7. The detection amplifier 130A of FIG. 10 may have the same structure and operation as the detection amplifier 130 of FIG. 5. Therefore, the operation of the receiver 200 can be understood easily based on the operation of the data receiver 100 of FIG. 5.

That is, the detection amplifier 130A of FIG. 10 senses and amplifies the output signals of the integration amplification circuit 110A in response to a clock signal CLK, and detects and outputs odd numbered data Q_OD of the data DATAi inputted through the data line 103.

The detection amplifier 130B of FIG. 10 senses and amplifies the output signals of the integration amplification circuit 110B in response to the inverted clock signal CLKB and detects and outputs even numbered data Q_EV of the data DATAi inputted through the data line 103. The detection amplifier 130B of FIG. 10 may have the same structure as the detection amplifier 130 of FIG. 5. Therefore, a detailed explanation on the data receiver 200 of FIG. 10 will be omitted.

The data receiver 100 or 200 according to one or more of the exemplary embodiments of the present invention receives data and differential reference signals and detects data in a stable manner by means of signal integration. Therefore, the data receiver 100 or 200 can detect data at a high speed using differential signaling and using one data line for each piece of data.

For example, if the data receiver using differential signaling receives 16 pieces of data simultaneously at a high speed, it must have 32 signal lines. However, the data receiver according to one or more of the exemplary embodiments of the present invention needs 2 differential reference signal lines and only 16 data lines.

In addition, the data receiver according to one or more of the exemplary embodiments of the present invention reduces power consumption and requires less layout space. Since the data receiver of one or more of the exemplary embodiments of the present invention operates in synchronization with the clock signal, it can detect data at a high frequency fast and in a stable manner. Furthermore, even when the difference between levels of signals inputted to the integration amplification circuit is small, or a process, a voltage level, or the temperature changes, data can be detected accurately.

As described above, the data receiver using the signal integration according to one or more of the exemplary embodiments of the present invention and the data receiving method can reduce high-frequency noises generated when data is detected at a high speed.

In addition, according to the data receiver and data receiving method that integrate and amplify signals inputted through two reference signal lines for each piece of data and one data line and detect data, data can be detected accurately at a high speed using differential signaling irrespective of changes in a process, voltage level, or temperature.

Although exemplary embodiments of the data receiver of the present invention have been illustrated in FIGS. 5 and 10, other equivalent data receivers could be designed by one of ordinary skill in the art; the data receivers of FIGS. 5 and 10 being merely exemplary. Similarly, although exemplary embodiments of the integration amplification circuit 110, 110A, 110B have been illustrated in FIGS. 5, 7 and 10, equivalent integration amplification circuits could be designed by one of ordinary skill in the art. Further, although exemplary embodiments of the signal operation and detection circuit 131 and the latch and hold circuit 137 have been illustrated in FIGS. 5 and 8 and 5 and 9, respectively, equivalent signal operation and detection circuits and latch and hold circuits could be designed as would be know to one of ordinary skill in the art.

It is further noted, that the exemplary embodiments described above identify specific logic levels and polarities (negative (N) and positive (P)), but it would be recognized by one of ordinary skill in the art that equivalent circuits with opposite logic levels and/or polarities could also be designed.

It is further noted, that in the context of the present specification and claims, the phrase "at least" indicates an equal number or more of the discussed or recited feature or element.

Although exemplary embodiments of the present invention have been described herein for illustrative purposes, various modifications and equivalents thereof can be made without departing from the spirit and scope of the present invention, as will be recognized by those skilled in the relevant art. Accordingly, the present invention is not limited to the disclosure, but instead its scope is to be determined entirely by the following claims.

What is claimed is:

1. A data receiver comprising:
    an integration amplification circuit receiving at least two differential reference signals and N (where N is a natural number greater than zero) data signals and integrating and amplifying differences between the at least two differential reference signals and one or more of the N data signals and outputting at least first differential signals and at least second differential signals; and
    a detection amplification circuit for receiving the at least first differential signals and the at least second differential signals and detecting a difference between the at least first differential signals and the at least second differential signals to detect a value of one or more of the N data signals.

2. The data receiver of claim 1, wherein the at least two differential reference signals are direct current (DC) or oscillating.

3. The data receiver of claim 1, wherein one or more of the N data signals are single ended signals.

4. A data receiver comprising:
    an integration amplification circuit for integrating and amplifying the difference between a first reference signal inputted through a first signal transmission line or the difference between a second reference signal inputted through a second signal transmission line and N (where N is a natural number greater than zero) data signals inputted through a third signal transmission line in response to a clock signal, and outputting at least first differential signals and at least second differential signals; and
    a detection amplification circuit for receiving the at least first differential signals and the at least second differential signals and detecting a difference between the at least first differential signals and the at least second differential signals to detect a value of one or more of the N data signals.

5. The data receiver of claim 4, wherein the at least two differential reference signals are direct current (DC) or oscillating.

6. The data receiver of claim 4, wherein one or more of the N data signals are single ended signals.

7. A data receiver comprising:
    a first integration amplification circuit for integrating and amplifying the difference between a first of at least two reference signals and N (where N is a natural number greater than zero) data signals and outputting at least first differential signals in response to a clock signal;
    a second integration amplification circuit for integrating and amplifying the difference between a second of at least two reference signals and the N data signals and outputting at least second differential signals in response to the clock signal; and
    a detection amplification circuit for receiving the at least first differential signals and the at least second differential signals and detecting a difference between the at least first differential signals and the at least second differential signals to detect a value of one or more of the N data signals in response to the clock signal,
    wherein the first reference signal and the second reference signal of the at least two reference signals are differential signals.

8. The data receiver of claim 7, wherein the first reference signal is inputted to a first input port of the first integration amplification circuit through a first signal transmission line, and the second reference signal is inputted to a first input port of the second integration amplification circuit through a second signal transmission line,
    wherein one or more of the N data signals is inputted to a second input port of each of the first integration amplification circuit and the second integration amplification circuit through a third signal transmission line.

9. The data receiver of claim 7, wherein the first integration amplification circuit comprises:
    a first precharge circuit for precharging the level of the at least first differential signals to the level of a first power voltage, in response to a first state of the clock signal; and
    a first amplification circuit for integrating and amplifying the difference between the first of the at least two reference signals and one or more of the N data signals and outputting the at least first differential signals in response to a second state of the clock signal,
    wherein the second integration amplification circuit comprises:
    a second precharge circuit for precharging the level of the at least two differential signals to the level of the first power voltage, in response to the first state of the clock signal; and
    a second amplification circuit for integrating and amplifying the difference between the second of the at least two reference signals and one or more of the N data signals and outputting the at least second differential signals in response to the second state of the clock signal.

10. The data receiver of claim 7, wherein the detection amplification circuit comprises:
    a detection circuit for detecting and amplifying the difference between the at least first differential signals or the difference between the at least second differential signals and outputting at least third differential signals; and
    a latch circuit for latching the at least third differential signals,
    wherein the at least third differential signals are precharged to the level of the first power voltage, in response to the first state of the clock signal, and are precharged to the CMOS level, in response to the second state of the clock signal.

11. A data receiver comprising:
    a first integration amplification circuit for integrating and amplifying the difference between at least two differential reference signals and N (where N is a natural number greater than zero) data signals and outputting at least first differential signals or at least second differential signals in response to a clock signal;
    a first detection amplification circuit for detecting and amplifying the difference between the at least first differential signals or the difference between the at least second differential signals and detecting odd numbered data of the N data signals in response to the clock signal;
    a second integration amplification circuit for integrating and amplifying the difference between the at least two differential reference signals and the N data signals and outputting at least third differential signals or at least fourth differential signals in response to the clock signal; and
    a second detection amplification circuit for detecting and amplifying the difference between the at least third differential signals or the difference between the at least fourth differential signals and detecting even numbered data of the N data signals in response to an inverted clock signal.

12. The data receiver of claim 11, wherein the at least two differential reference signals are direct current (DC) or oscillating.

13. The data receiver of claim 11, wherein one or more of the N data signals is a single ended signal.

14. A data receiving method comprising:
   (a) integrating and amplifying the difference between at least two differential reference signals and N (where N is a natural number greater than zero) data signals and outputting at least first differential signals or at least second differential signals in response to a clock signal; and
   (b) detecting and amplifying the difference between the at least first differential signals or the difference between the at least second differential signals and detecting one or more of the N data signals in response to the clock signal.

15. The data receiving method of claim 14, wherein (a) comprises:
   (a1) precharging the levels of the at least first differential signals and the at least second differential signals to a first power voltage level, in response to a first state of the clock signal; and
   (a2) integrating and amplifying the difference between the at least two reference signals and one or more of the N data signals and outputting the at least first differential signals or the at least second differential signals in response to a second state of the clock signal.

16. The data receiving method of claim 14, wherein (b) comprises:
   (b1) detecting and amplifying the difference between the at least first differential signals or the difference between the at least second differential signals and outputting at least third differential signals; and
   (b2) precharging the at least third differential signals to the first power voltage level, in response to the first state of the clock signal, and outputting the at least third differential signals having the CMOS level, in response to the second state of the clock signal.

17. The data receiving method of claim 14, wherein the at least two differential reference signals, which are direct current (DC) or oscillating, are received in step (a).

18. The data receiving method of claim 14, wherein one or more of the N data signals, which are single ended signals, are received in step (a).

19. A data receiving method comprising:
   (a) integrating and amplifying the difference between at least two differential reference signals inputted through a first signal transmission line or a second signal transmission line, in response to a clock signal, and N (where N is a natural number greater than zero) data signals inputted through a third signal transmission line and outputting at least first differential signals or at least second differential signals; and
   (b) detecting and amplifying the difference between the at least first differential signals or the difference between the at least second differential signals and detecting one or more of the N data signals in response to the clock signal.

20. The data receiving method of claim 19, wherein (a) comprises:
   (a1) precharging the levels of the at least first differential signals and the at least second differential signals to a first power voltage level, in response to a first state of the clock signal; and
   (a2) integrating and amplifying the difference between a first of the at least two reference signals and one or more of the N data signals and outputting the at least first differential signals in response to a second state of the clock signal, or integrating and amplifying the difference between a second of the at least two reference signals and one or more of the N data signals and outputting the at least second referential signals.

21. The data receiving method of claim 19, wherein (b) comprises:
   (b1) detecting and amplifying the difference between the at least first differential signals or the difference between the at least second differential signals and outputting at least third differential signals; and
   (b2) precharging the at least third differential signals to the first power voltage level, in response to the first state of the clock signal, and outputting the at least third differential signals having the CMOS level, in response to the second state of the clock signal.

* * * * *